United States Patent [19]

Itoh

[11] Patent Number: 5,766,696
[45] Date of Patent: Jun. 16, 1998

[54] PLASMA PROCESSING METHOD

[75] Inventor: Kenji Itoh, Kanagawa, Japan

[73] Assignee: Semiconductor Energy Laboratory Co., Ltd., Kanagawa, Japan

[21] Appl. No.: 847,497

[22] Filed: Apr. 25, 1997

Related U.S. Application Data

[62] Division of Ser. No. 409,679, Mar. 23, 1995, Pat. No. 5,652,029.

Foreign Application Priority Data

Mar. 25, 1994 [JP] Japan ................................ 6-079675

[51] Int. Cl.$^6$ .................................................. H05H 1/24
[52] U.S. Cl. ........................... 427/577; 427/131; 427/249; 427/261; 427/402; 427/585
[58] Field of Search .............................. 427/577, 585, 427/131, 249, 261, 402

[56] References Cited

U.S. PATENT DOCUMENTS

| | | | |
|---|---|---|---|
| 4,655,167 | 4/1987 | Nakamura et al. | 118/718 |
| 5,108,571 | 4/1992 | Ludwig | 204/192.13 |
| 5,203,924 | 4/1993 | Mitani et al. | 118/719 |
| 5,296,036 | 3/1994 | Matsuyama | 118/718 |
| 5,300,189 | 4/1994 | Kokaku | 156/643 |
| 5,360,483 | 11/1994 | Kurokawa et al. | 118/723 E |
| 5,437,725 | 8/1995 | Schuster | 118/718 |
| 5,522,343 | 6/1996 | Kodama et al. | 118/723 MP |
| 5,540,781 | 7/1996 | Yamagami et al. | 118/723 E |

*Primary Examiner*—Bernard Pianalto
*Attorney, Agent, or Firm*—Sixbey, Friedman, Leedom & Ferguson, P.C.; Gerald J. Ferguson, Jr.

[57] ABSTRACT

In a plasma processing apparatus including a cylindrical electrode and plural electrodes which are disposed to face the cylindrical electrode in a circumferential direction of the cylindrical electrode, the plural electrodes are designed to have the prescribed curvature corresponding to that of the surface of the cylindrical electrode. The interval between the cylindrical electrode and the plural electrodes may be fixed or stepwise varied in the circumferential direction. The area of each of the plural electrodes may be different from that of the other electrodes.

17 Claims, 7 Drawing Sheets

PLASMA PROCESSING METHOD

This is a Divisional application of Ser. No. 08/409,679, filed Mar. 23, 1995 U.S. Pat. No. 5,652,029.

BACKGROUND OF THE INVENTION

1. Field of the Invention

The present invention relates to a plasma processing apparatus and a plasma processing method for performing various plasma processing for film formation, an etching, etc. through a gas phase reaction, and more particularly to a plasma processing apparatus and a method for performing various plasma processing for film formation, a surface treatment, etc. on a tape-shaped or film-shaped substrate such as a magnetic tape.

2. Description of Related Art

There has been hitherto known a technique for forming a carbon film or the like as a protection film on the surface of a tape-shaped or film-shaped substrate such as a magnetic tape or the like. FIG. 1 shows one of apparatuses which are capable of implementing such a technique. The apparatus shown in FIG. 1 includes a cylindrical can roll 103, a tape-shaped or film-shaped substrate 115 which is fed by rotation of the can roll 103, a flat plate electrode 300 which is disposed to face the can roll 103, and a high-frequency power source 108 for supplying a high-frequency power to the flat electrode 300 through a matching box 107 and a blocking capacitor 106. In the following description, the can roll is referred to as "one electrode", and the flat plate electrode is referred to as "the other (or counter) electrode". The substrate 115 is fed out from a feed-out roller 113 through a guide roller 104 to the can roll 103, and then a carbon film (coating) is formed on the substrate 115 by a high-frequency discharge which is induced in a gap between the can roll 103 and the flat electrode 300. Raw gas is supplied from a gas supply system 102, and hydrocarbon gas such as ethylene or the like may be used as the raw gas to form a carbon film.

The substrate 115 on which the film formation is completed is fed through a guide roller 104 and taken up by a take-up roller 114. The film forming operation of the carbon film on the surface of the substrate 115 is continuously performed while feeding the substrate. In the apparatus shown in FIG. 1, a feed-out chamber 111 in which the feed-out roller 113 is disposed and a take-up chamber 112 in which the take-up roller 114 is disposed are kept in an atmospheric state, and a film forming chamber 101 in which the film formation is performed is kept in a pressure-reduced state. Therefore, a buffer chamber 110 is provided between the film forming chamber 101 and each of the feed-out chamber 111 and the take-up chamber 112 to thereby constitute a differential exhaust system. Normal stainless steel or aluminum is used as a component for the chamber 100. The apparatus further includes an exhaust pump 109 for exhausting gas from the film forming chamber 101, and exhaust pumps 116 for exhausting gas from the buffer chambers 110.

The can roll 103 constituting the one electrode has a cylindrical body which is elongated in the vertical direction on the surface of the drawing, and it is grounded. That is, the flat electrode 300 serves as a cathode electrode and the can roll 103 serves as an anode electrode.

When a longitudinal substrate such as a magnetic tape or the like is used as the substrate 115 in the apparatus as shown in FIG. 1, the feeding speed of the substrate is required to be as high as possible in order to improve its productivity. However, when the feeding speed of the substrate 115 is increased, the thickness of a film formed on the substrate 115 becomes smaller. In addition, when a carbon film or the like is used as the surface protection film, there occurs a problem in its adhesiveness to the substrate.

SUMMARY OF THE INVENTION

An object of the present invention is to provide a plasma processing system (a plasma processing apparatus and a plasma processing method) which can improve productivity by achieving at least following items:

(1) increase of the film forming speed;

(2) improvement in plasma processing efficiency; and (3) realization of film quality having high adhesiveness.

In order to attain the above object, according to one aspect of the present invention, the system includes two types of electrodes which are disposed to confront each other in the system, one electrode comprising a single electrode (single one electrode), and the other electrode comprising a number of electrodes (counter electrodes). For example, as shown in FIG. 2, the system includes a cylindrical electrode (can roll) 103 serving as the one electrode, and plural electrodes 105 serving as the other electrode.

In the system as described above, as shown in FIG. 2, the plural counter electrodes 105 are arranged around the electrode 103 so as to be in concentrical relation with the surface (cylindrical surface) of the electrode 103. This means that the plural counter electrodes 105 are disposed at positions which are concentrical with the cylindrical surface of the electrode 103. With this arrangement, the plural counter electrodes 105 can be disposed away from the electrode 103 substantially at an equidistance at any position. The electrode 103 is designed in a cylindrical shape whose longitudinal direction is perpendicular to the surface of the drawing, and each of the electrodes 105 is designed in a rectangular parallelopiped shape whose longitudinal direction is perpendicular to the surface of the drawing.

Each of the electrodes 105 may be designed to have a prescribed curvature (i.e., to be curved in section) like electrodes 200 as shown in FIG. 3. In this case, if the curvature of each electrode 105 is set to such a value as to meet that of the surface of the cylindrical electrode 103, the distance between the electrode 103 and each of the plural counter electrodes 200 can be set to substantially the same value at any position.

Furthermore, plural matching boxes 410 to 414 may be arranged so as to be individually and independently allocated to the respective plural electrodes 400 to 404 as shown in FIG. 4. With this arrangement, a different high-frequency power can be applied to each of the electrodes 400 to 404. The plural electrodes 400 to 404 are required to be arranged along a specific direction, and the substrate is subjected to a plasma processing for a film formation process or the like while feeding a substrate along the specific direction. For example, the plural electrodes 400 to 404 are arranged along a circumferential direction of the surface of the cylindrical electrode 103, and a substrate 115 (in this case, a tape-shaped or film-shaped substrate) is subjected to the plasma processing for the film formation or the like while fed along the direction as indicated by an arrow.

In the arrangement as described above, it is effective that the high-frequency power to be supplied to each of the electrodes 400 to 404 is gradually varied along the arrangement direction of the electrodes 400 to 404. For example, a stepwise-increasing power may be applied to the electrodes 400 to 404 in this order as follows: the electrode 400 is supplied with a high-frequency power of 100 W from a high-frequency power source 415, the electrode 401 is supplied with a high-frequency power of 200 W from a high-frequency power source 416, the electrode 402 is supplied with a high-frequency power of 300 W from a high-frequency power source 417, the electrode 403 is supplied with a high frequency power of 400 W from a high-frequency power source 418, and the electrode 404 is supplied with a high-frequency power of 500 W from a high-frequency power source 419. In this case, the power to be applied to the respective electrodes 400 to 404 is stepwise varied along the circumferential direction of the electrode 103.

Besides, a triangularly-varying power may be applied to the respective electrodes 400 to 404 as follows: the electrode 400 is supplied with 100 W from the high-frequency power source 415, the electrode 401 is supplied with 200 W from the high-frequency power source 416, the electrode 402 is supplied with 300 W from the high-frequency frequency power source 417, the electrode 403 is supplied with 200 W from the high-frequency power source 418, and the electrode 404 is supplied with 100 W from the high-frequency power source 419.

On the other hands, all the electrodes 400 to 404 are not necessarily supplied with different high-frequency powers. For example, the electrodes 400, 401 and 402 are supplied with the same power (for example, 100 W) from the high-frequency power sources 415, 416 and 417, the electrode 403 is supplied with 300 W from the high-frequency power source 418 and the electrode 404 is supplied with 500 W from the high-frequency power source 419. That is, the power to be applied to at least one of the plural electrodes 400 to 404 is set to be different from the power to be applied to the other electrodes.

According to another aspect of the present invention, the system includes two types of electrodes which are disposed to confront each other in the system, one electrode comprising a single electrode, and the other electrode comprising a number of electrodes (counter electrodes) for the one single electrode. In this system, the distance between the one electrode and at least one of the counter electrodes is set to be different from the distance between the one electrode and each of the other counter electrodes.

FIG. 6 shows an embodiment of the system as described above. In FIG. 6, plural counter electrodes 400 to 404 are arranged for a one electrode 103, and the distance (interval) $X_1$ to $X_5$ between the one electrode 103 and each of the counter electrodes 400 to 404 is stepwise varied. In this case, the distance $X_1$ to $X_5$ is stepwise decreased in this order.

According to another aspect of the prevent invention, the system includes two types of electrodes which are disposed to confront each other in the system, one electrode comprising a single electrode, and the other electrode comprising a number of electrodes (counter electrodes) for the one single electrode. In this system, the area of at least one of the counter electrodes is set to be different from the area of the other counter electrodes.

In this system, the plural counter electrodes are arranged in a specific direction for the one electrode, and it is effective to arrange the plural counter electrodes so that the area of each counter electrode is stepwise varied in the specific direction. With this arrangement, the intensity of discharge can be varied in accordance with variation of the area of each counter electrode, so that a plasma processing (for example, film formation) which is stepwise varied can be performed.

According to the present invention, a plurality of counter electrodes are arranged so as to confront a cylindrical one electrode, so that the efficiency of a plasma reaction occurring in a gap between both of the electrodes can be substantially increased. Particularly when film formation is continuously conducted on a tape-shaped or film-shaped substrate while feeding the substrate along the circumferential surface of the cylindrical one electrode, the substantial film forming speed can be increased in proportion to the number of the other (counter) electrodes.

According to the system of the present invention, the counter electrodes are designed in small size, so that the plasma density can be increased and thus the reaction efficiency can be heightened.

According to the system of the present invention, the plural counter electrodes are arranged substantially concentrically with the surface of the cylindrical electrode, so that the distance between the one electrode and each of the counter electrode can be set to a substantially constant value, and the stability and uniformity of discharge can be more improved. In particular, the distance between the cylindrical electrode and the counter electrodes can be made more constant by giving each of the counter electrodes with a curved surface.

According to the system of the present invention, the plural counter electrodes are arranged to confront the one electrode in one direction, and the high-frequency power to be supplied to the counter electrodes is stepwise varied. Accordingly, when the film formation is performed on a substrate while feeding the substrate through the gap between the one electrode and the counter electrodes, a thin film having gradually-varying (stepwise-varying) film quality can be formed on the substrate. That is, a stepwise-varying plasma processing can be performed.

For example, the high-frequency power to be supplied to the surface of the substrate is gradually increased in a direction along the direction in which the substrate is moved. When a carbon film is formed on the substrate in this system, the carbon film has such film quality that its hardness (rigidity) gradually increases from an inner portion of the film which is near to the substrate surface to the outer surface of the film. Such a film have excellent adhesiveness to the substrate because a portion of the film which is directly contacted with the substrate has low rigidity (i.e., is softy), and at the same time it has the hard surface, so that it can be effectively used as a surface protection film.

Also, according to the system of the present invention, the interval (distance) between the one electrode and each of the counter electrodes is gradually varied. In this system, when the film formation is conducted on a substrate with the substrate moving through the gap, the film quality of the film thus formed can be gradually varied in accordance with the interval between the electrodes. For example, a carbon film having hardness (rigidity) which gradually increases from a portion contacted with the substrate to the surface of the film.

DETAILED DESCRIPTION OF THE PREFERRED EMBODIMENTS

Preferred embodiments according to the present invention will be described hereunder with reference to the accompanying drawings.

In the following embodiments, a carbon film is formed on a tape-shaped or film-shaped substrate. However, any different material may be used as the substrate. Furthermore, in the following embodiment, a cylindrical electrode is used as the one electrode. However, the shape of the one electrode is not limited to the cylindrical shape, for example, a flat plate type electrode may be used as the one electrode.

(Embodiment 1)

Figure 1:
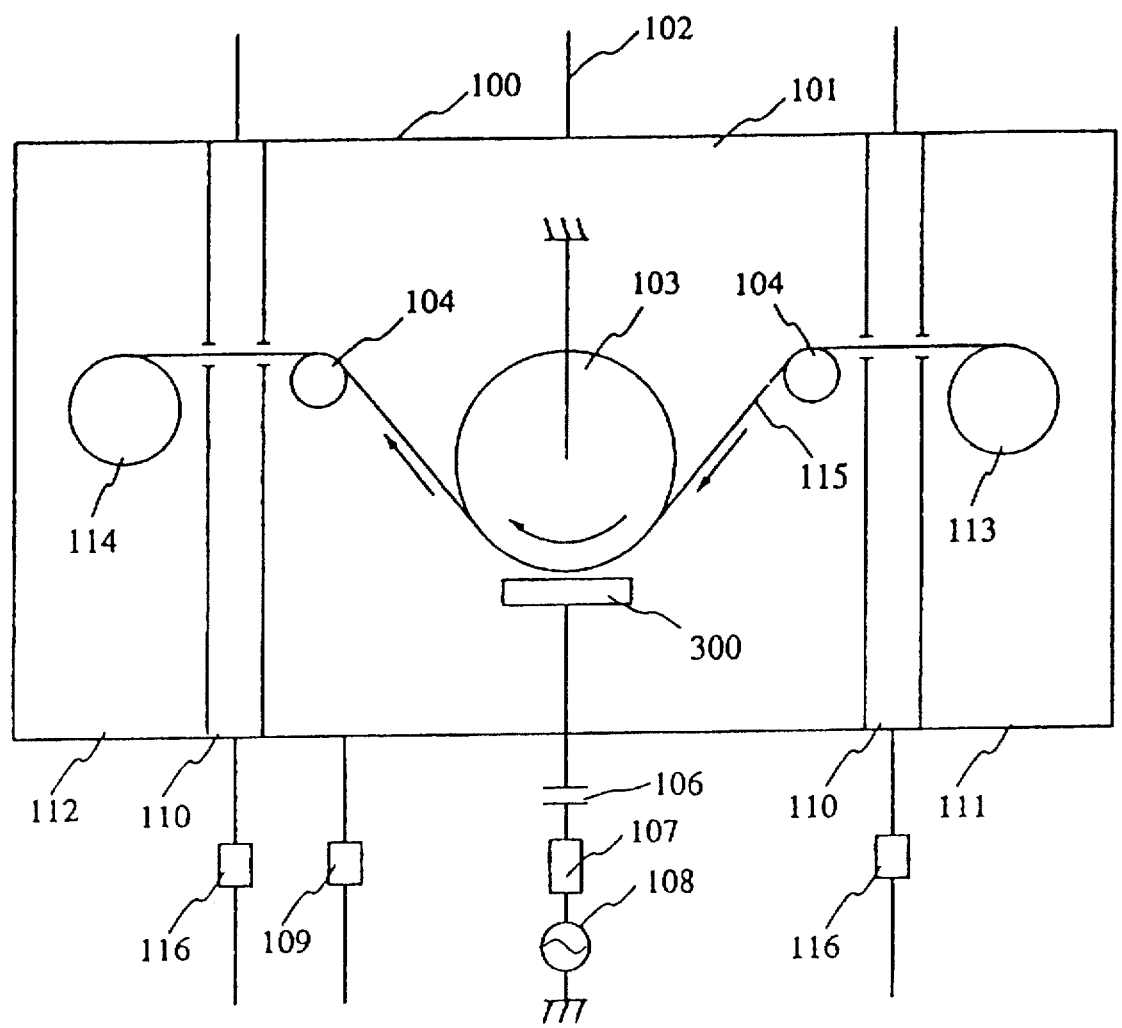
FIG. 1 is a schematic view showing a conventional plasma processing system.
Figure 2:
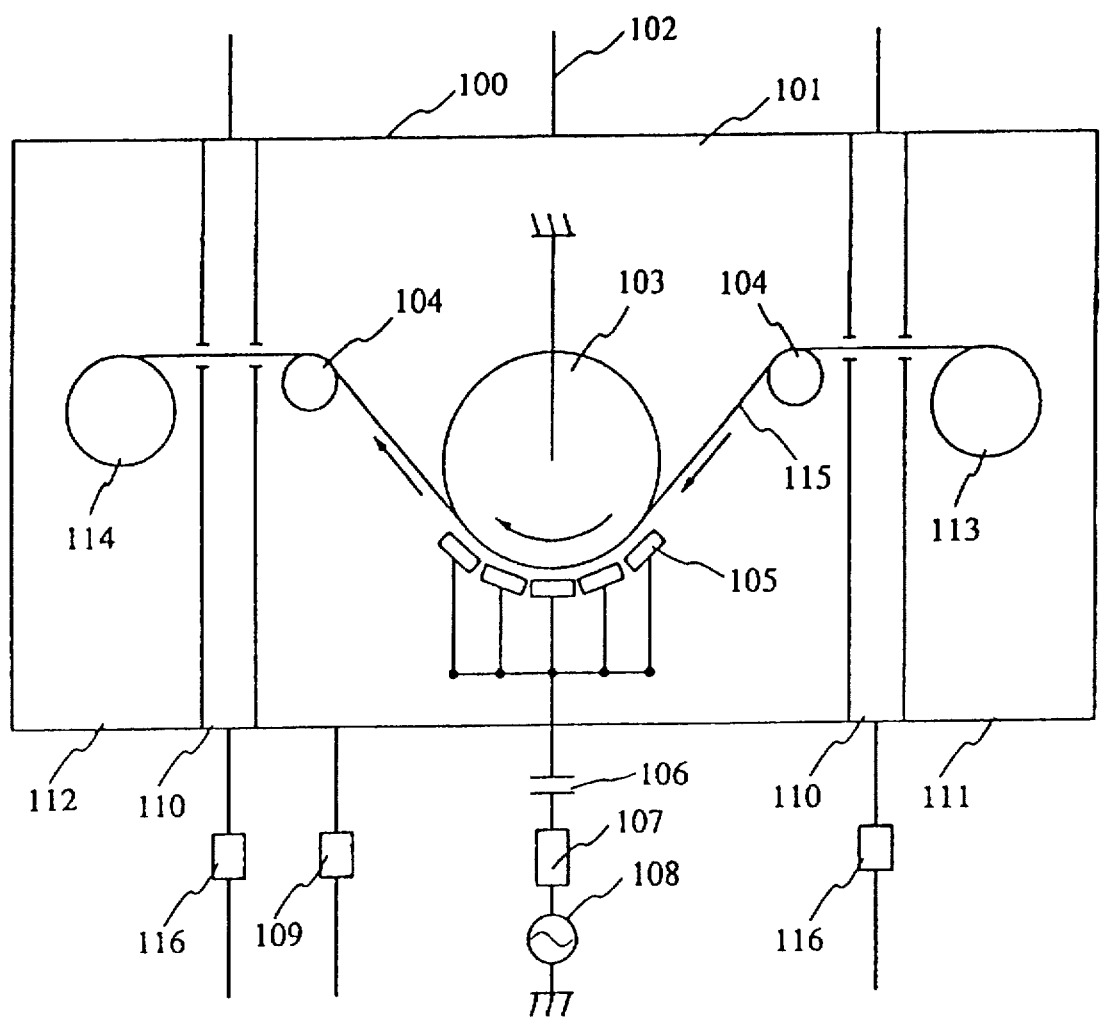
FIG. 2 is a schematic view showing a plasma processing system of an embodiment of the present invention.

In this embodiment, a carbon film is formed on the surface of a magnetic tape according to a plasma processing system (apparatus and method). FIG. 2 shows a plasma processing apparatus of this embodiment. In FIG. 2, reference numeral 100 represents a vacuum chamber formed of stainless steel, which includes a reaction chamber 101, and the reaction chamber 101 is allowed to be kept in a pressure-reduced state. An exhaust pump 109 is actuated to reduce the pressure in the reaction chamber 101. Methane gas and hydrogen gas are supplied as raw gas into the reaction chamber 101 from a gas supply system 102. The film formation of the carbon film is conducted on the surface of the magnetic tape 115. The magnetic tape 115 comprises a resin material of polyimide or the like on which magnetic material is beforehand laminated in a layer structure by a deposition or sputtering method.

The magnetic tape 115 is fed out from the feed-out roll 113, and guided through the guide roller 104 to the can roll 103. The magnetic tape 115 is fed into a gap (gas reaction space) between the can roll 103 and the plural electrodes 105 by rotation of the can roll 103, and in the gas reaction space a carbon film is formed on the surface of the magnetic tape 115 on which magnetic material is beforehand formed.

The magnetic tape having the carbon film thereon is passed through the guide roller 104 and taken up by the take-up roll 114. A feed-out chamber 111 in which the feed-out roll 113 is placed and a take-up chamber 112 in which the take-up roll 114 is placed are kept in an atmospheric pressure. These chambers 111 and 112 intercommunicate with the reaction chamber 101 under the reduced state through buffer chambers 110. The pressure in the buffer chambers 110 is kept to an intermediate pressure between the reduced pressure of the reaction chamber 101 and the atmospheric pressure of the chambers 111 and 112. The buffer chambers serve to moderate the pressure difference between the reaction chamber 101 and the chambers 111 and 112. In FIG. 2, only one buffer chamber is provided between the reaction chamber 101 and each of the chambers 111 and 112, however, the number of buffer chambers may be increased.

The can roll 103 is designed in a cylindrical shape whose longitudinal direction is perpendicular to the surface of the drawing, and its length is required to be larger than the width of the magnetic tape 115. Each of electrodes 105 is a rectangular flat-plate electrode whose longitudinal direction is perpendicular to the surface of the drawing, and the length of each electrode 105 is equal to that of the can roll 103.

The plural electrodes 105 are supplied with a high-frequency power of 13.56 MHz from a high-frequency power source 108 through a matching box 107 and a blocking capacitor 106.

In the apparatus shown in FIG. 2, the diameter and length of the can roll 103 are set to 650 mm and 900 mm. The width and length of each flat-plate electrode 105 are set to 90 mm and 900 mm, and thus it has a rectangular parallelopiped shape. Totally, five flat-plate electrodes thus constructed are provided. The distance (interval) between the surface of the can roll 103 and the center of each flat-plate electrode is preferably set to 10 mm or less, and it is set to 8 mm in this embodiment. This distance condition is extremely important to increase a film forming speed and obtain a carbon film having high rigidity.

A film forming condition is as follows. This film forming condition is adopted in the case where a polyimide film of 700 mm width and 5 km length on which magnetic material is deposited at a thickness of 0.2 mm is used as the magnetic tape 115.

Raw gas: ethylene/hydrogen=3000/1000 sccm

High frequency power: 5 kW (13.56 MHz)

Film forming pressure: 1 Torr

Feeding speed of magnetic tape 115: 100 m/minute (Embodiment 2)

In FIG. 2, the can roll 103 is grounded. This arrangement is adopted because when the can roll 103 is connected to the high-frequency power source, the high-frequency power is also applied to the tape-shaped or film-shaped substrate on which the magnetic material serving as a conductor is formed, and thus some problems occur in stability and safety of the film formation. However, if the substrate is formed of an insulation member, the can roll 103 may be connected to the high-frequency power source while the plural flat-plate electrodes 105 are grounded. In such a case, the can roll 103 is used as the cathode electrode while the plural flat-plate electrodes 105 are used as the anode electrode.

(Embodiment 3)

Figure 3:
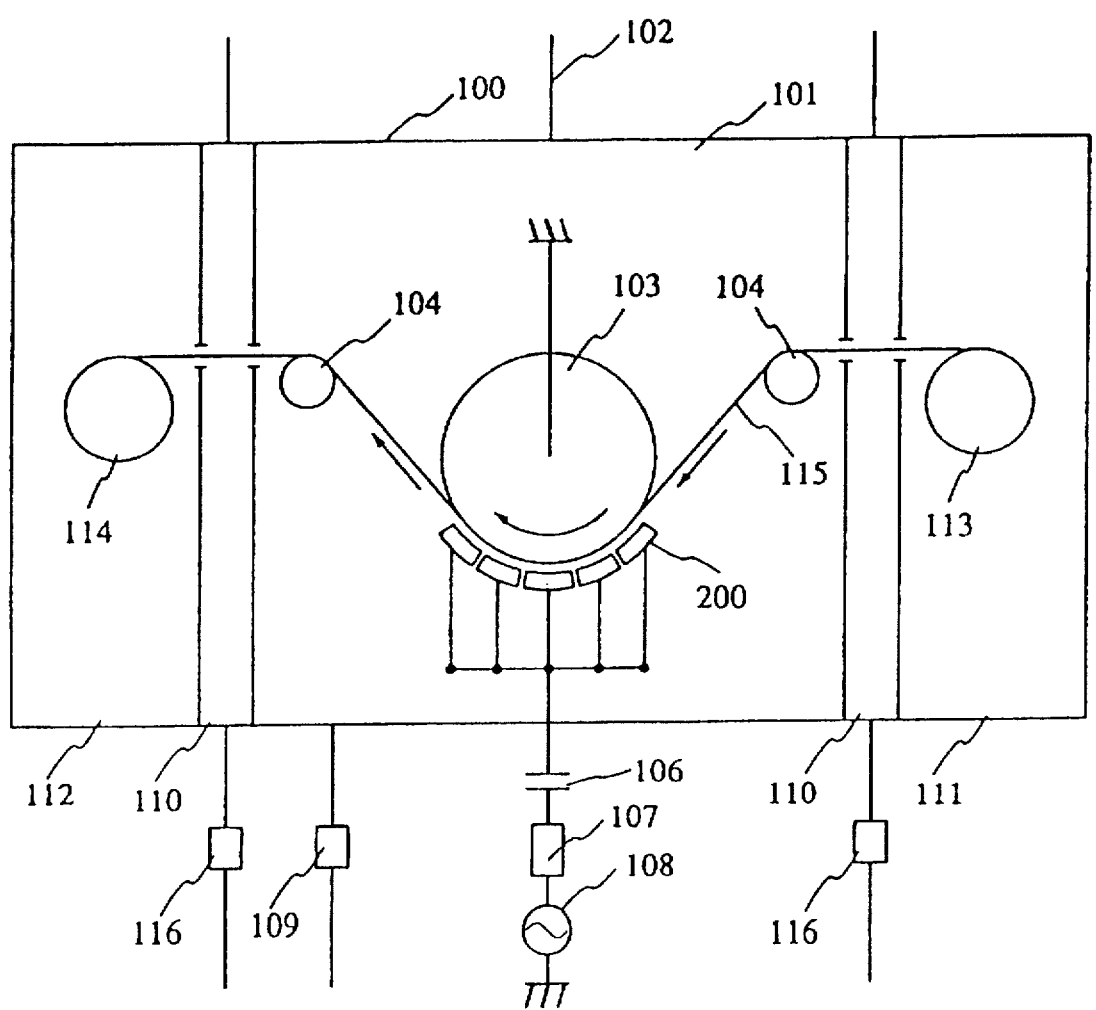
FIG. 3 is a schematic view showing another embodiment of the plasma processing system of the present invention.

In this embodiment, the counter electrodes 105 in the apparatus shown in FIG. 2 is not designed to be flat-plate shaped, but designed to be curved in section (i.e., have a round R (curvature). FIG. 3 shows a plasma processing apparatus using the round counter electrodes 105. The same elements as the embodiment of FIG. 2 are represented by the same reference numerals. The construction of the apparatus of FIG. 3 is substantially identical to that of the apparatus of FIG. 2, except for the structure of the counter electrodes 200. Each of the counter electrodes 200 is designed to have the curvature corresponding to the curved surface (curvature) of the can roll 103. In this embodiment, totally five counter electrodes 200 are disposed so as to confront the one electrode 103 like the embodiment 1.

The counter electrodes 200 are arranged substantially in concentrical relation with the surface of the can roll 103. That is, the center of a circle having a prescribed curvature on which the plural counter electrodes 200 are arranged is substantially identical to the center of the can roll 103. Accordingly, the distance between the surface of the can roll 103 and the each of the plural counter electrodes 200 is substantially constant at any position.

By designing the counter electrodes 200 in the round shape as shown in FIG. 3, the distance between the grounded can roll 103 and each of the plural electrodes 200 connected to the high-frequency power source 108 can be set to a fixed or substantially fixed value, thereby inducing stable discharge.

(Embodiment 4)

Figure 4:
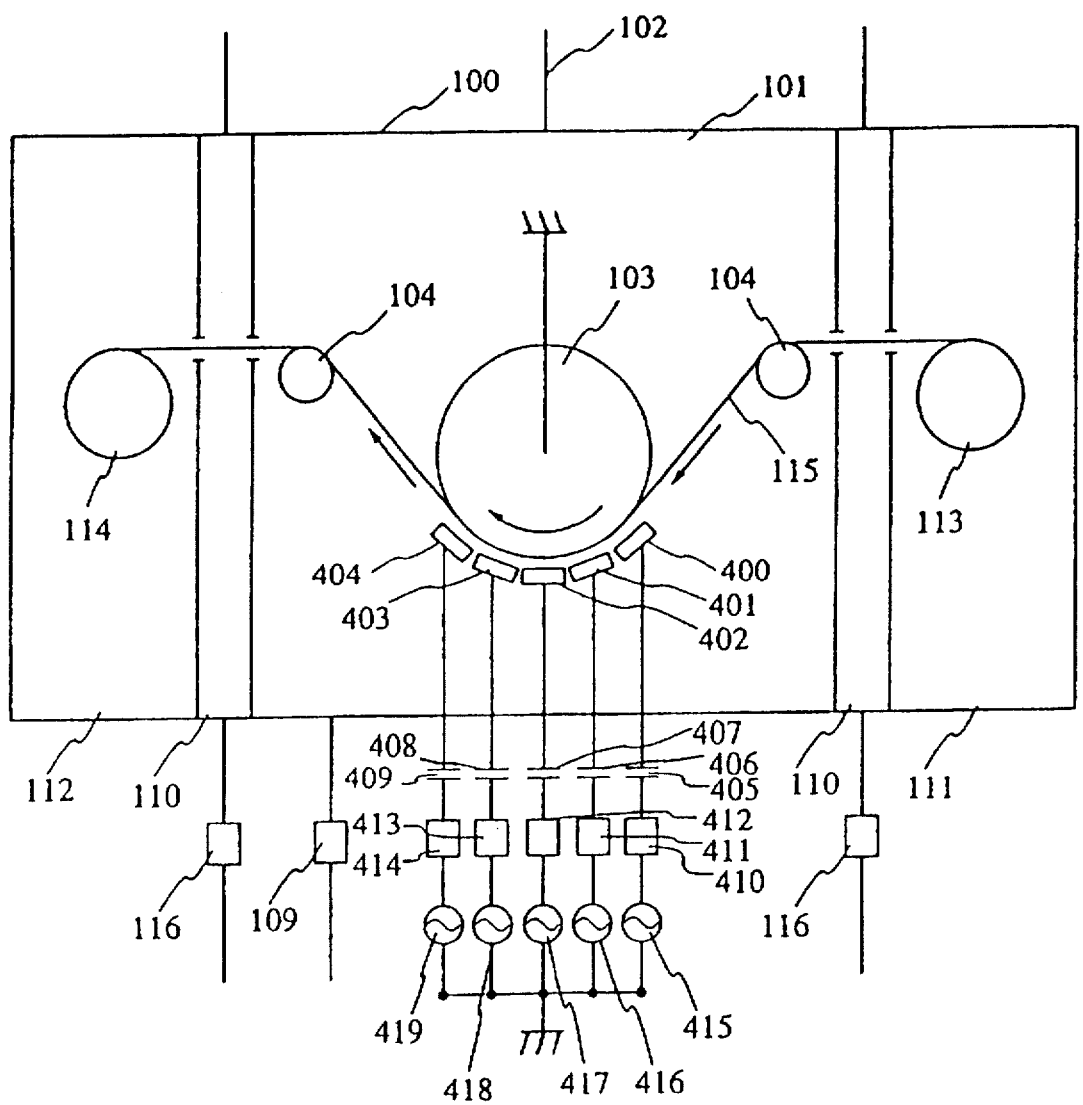
FIG. 4 is a schematic view showing another embodiment of the plasma processing system of the present invention.

In this embodiment, the plural counter electrodes 105 in the apparatus of the embodiment 1 (see FIG. 2) are individually connected to power sources which are provided independently of one another. FIG. 4 shows a plasma processing apparatus of this embodiment. The reference numerals as the embodiment 1 represent the same elements.

As shown in FIG. 4, power sources 415 to 419 which are provided independently of one another are connected through matching boxes 410 to 414 and blocking capacitors 405 to the counter electrodes 400 to 404.

The power sources 415 to 419 are designed to have larger output powers in this order. The magnetic tape 115 serving as the substrate is successively passed in the direction from the electrode 400 to the electrode 404. Accordingly, during the feeding of the magnetic tape 115 from the electrode 400 to the electrode 404, the film formation is performed on the surface of the magnetic tape 115 while gradually intensifying the discharge power.

In the case of the film formation for a carbon film, it has been experimentally proved by the inventors that a carbon film having high hardness (rigidity) is obtained as the discharge power is intensified, whereas a carbon film having low hardness is obtained as the discharge power is reduced. Accordingly, in this case, a hard film is gradually formed on the surface of the magnetic tape during the feeding of the magnetic tape.

Furthermore, the film quality of the low hardness has excellent adhesiveness to the substrate, but has low abrasion resistance. On the other hand, the film quality of the high hardness has excellent abrasion resistance, but has low adhesiveness to the substrate, so that the film is liable to be peeled off.

As a method of solving this problem, there is used a method of forming a carbon film in such an oblique structure that a portion of the film which is contacted with the substrate is made to have low hardness, and the surface of the film is made to have high hardness. With this structure, the portion of the film which is contacted with the substrate has high adhesiveness to the substrate because of its low hardness, and at the same time the outer surface portion of the film has high abrasion resistance because of its high hardness.

The film forming condition of this embodiment is listed. In this embodiment, a magnetic tape 115 of 700 mm width which has a magnetic material deposited on the surface thereof (both sides on which a carbon film is formed) is used as the substrate. The frequency of all the power sources is set to 13.56 MHz.

Film forming pressure: 1 Torr
Feeding speed: 80 m/minute
Raw material: $C_2H_4/H_2$=3000/1000 SCCM
Interval between electrodes: 8 mm
Output of power source 415: 700 W
Output of power source 416: 900 W
Output of power source 417: 1100 W
Output of power source 418: 1300 W
Output of power source 419: 1500 W Through the film formation under the film forming condition as described above, a carbon film having 150 Å thickness can be formed. Furthermore, through this film forming process, the carbon film whose hardness gradually increases from the substrate to the surface of the film can be continuously formed. Therefore, the carbon film having excellent adhesiveness to the substrate and high abrasion resistance can be formed.

In the above embodiment, the power to be applied to the counter electrodes 400 to 404 is increased in the feeding direction of the magnetic tape 115 serving as the substrate, that is, in the direction of the alignment of the electrodes 400 to 404. However, the power supply mode (variation of the power to be applied to the counter electrodes) is not limited to the above mode. For example, when only the surface layer is required to have high hardness, the power to be applied to the electrodes 403 and 404 or only the electrode 404 may be increased.

(Embodiment 5)

Figure 5:
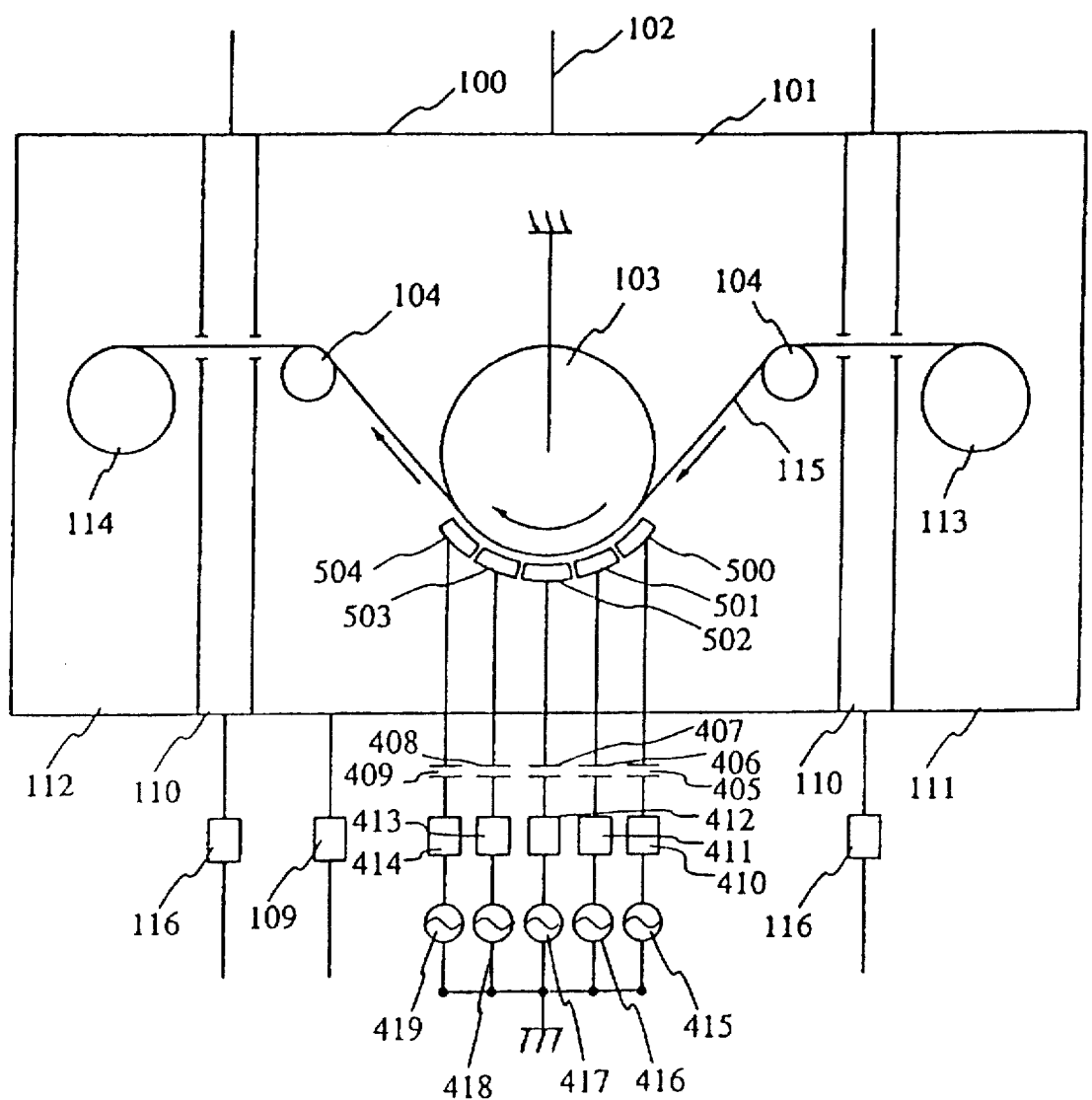
FIG. 5 is a schematic view showing another embodiment of the plasma processing system of the present invention.

In this embodiment, the counter electrodes 400 to 404 shown in FIG. 4 are designed to have a prescribed curvature (i.e., to be curved). FIG. 5 shows a plasma processing apparatus using the counter electrodes of this embodiment. The same elements as the embodiment shown in FIG. 4 are represented by the same reference numerals.

In this embodiment, the counter electrodes 500 to 504 have the same curvature. The curved surface which is formed by the arrangement of these counter electrodes 500 to 504 is substantially concentrical with the curved surface (the surface of the cylinder) corresponding to the surface of the can roll 103 serving as the one electrode. That is, the center of the curved surface (cylinder) constituted by the surfaces of the counter electrodes 500 to 504 is substantially identical to the center of the curved surface (the surface of the cylinder) corresponding to the surface of the can roll 103 serving as the one electrode. Accordingly, the interval between the can roll 103 and the electrodes 500 to 504 is substantially unvaried at any position.

The arrangement of this embodiment enables a stable discharging operation. The operation of the apparatus of this embodiment is identical to that of the embodiment 4, and the description thereof is omitted.

(Embodiment 6)

Figure 6:
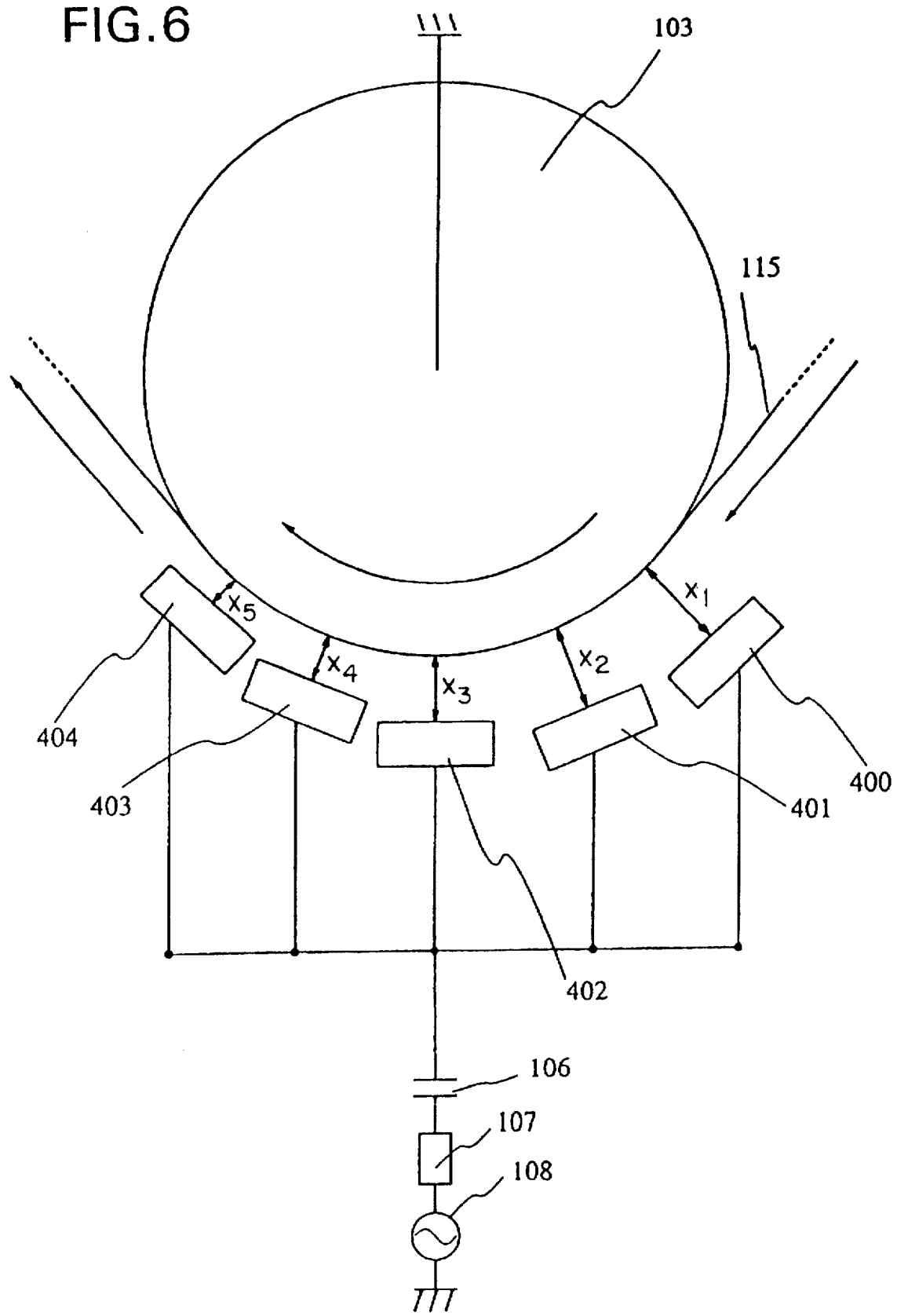
FIG. 6 is a schematic view showing another embodiment of the plasma processing system of the present invention.

In this embodiment, the counter electrodes 105 shown in FIG. 2 are arranged away from the can roll 103 at different intervals. FIG. 6 is an enlarged view of the can roll 103 (one electrode) and the counter electrodes 400 to 404 of this embodiment. No chamber and no exhaust device are illustrated in FIG. 6 to simplify the construction of this embodiment, however, the same elements as shown in FIG. 2 are also actually provided to the apparatus of this embodiment.

In the electrode arrangement shown in FIG. 6, the intervals $X_1$ to $X_5$ between the surface of the can roll 103 and the respective electrodes 400 to 404 are successively decreased in this order.

The can roll 103 and each of the counter electrodes 400 to 404 constitutes each paired electrode. That is, each of the plural counter electrodes 400 to 404 and the common one electrode (can roll) 103 constitutes each paired electrode.

It has been proved in the film forming process for carbon films by the inventors that as the interval of the paired electrode is increased, the hardness of the film can be lowered, whereas as the interval of the paired electrode is decreased, the hardness of the film can be increased.

Accordingly, in the case where a carbon film is formed on a tape-shaped or film-shaped substrate 115 between the can roll (one electrode) 103 and the flat plate electrodes (counter electrodes) 400 to 404 while feeding the substrate in the direction as indicated by an arrow of FIG. 6, a carbon film having relatively low hardness is first formed on the substrate between the can roll 103 and the flat plate electrode 400, however, a carbon film having higher hardness is gradually formed on the substrate as the substrate is fed from the counter electrode 400 to the counter electrode 404.

Through the film forming process as described above, the carbon film having the hard surface and high adhesiveness to the substrate can be continuously formed on the tape-shaped or film-shaped substrate surface.

The film forming condition of this embodiment is as follows. The same electrode dimension as the embodiment 1 is adopted.

Film forming pressure: 1 Torr
Raw gas: $C_2H_4/H_2=3000/1000$ SCCM
Output of power source (13.56 MHz): 5 kW
$X_1=18$ mm
$X_2=15$ mm
$X_3=12$ mm
$X_4=9$ mm
$X_5=6$ mm
Feeding speed: 80 m/minute Through the film forming process under the above film forming condition, a carbon film having high adhesiveness to the substrate and excellent abrasion resistance can be formed at a thickness of 150 Å.

In the embodiment shown in FIG. 6, each of the plural counter electrodes 400 to 404 is designed as a flat plate electrode, however, each counter electrode may be designed to have a prescribed curvature as shown in FIG. 3. That is, the electrodes 400 to 404 may be designed to have such a curvature that the interval between the can roll 103 and each counter electrode is substantially set to a fixed value at any position.

In the apparatus shown in FIG. 6, the power source is commonly connected to the counter electrodes 400 to 404, and thus these counter electrodes 400 to 404 are supplied with the same high frequency power of the same frequency. However, the counter electrodes 400 to 404 may be individually connected to different power sources which are independently provided as shown in FIGS. 4 and 5.

(Embodiment 7)

Figure 7:
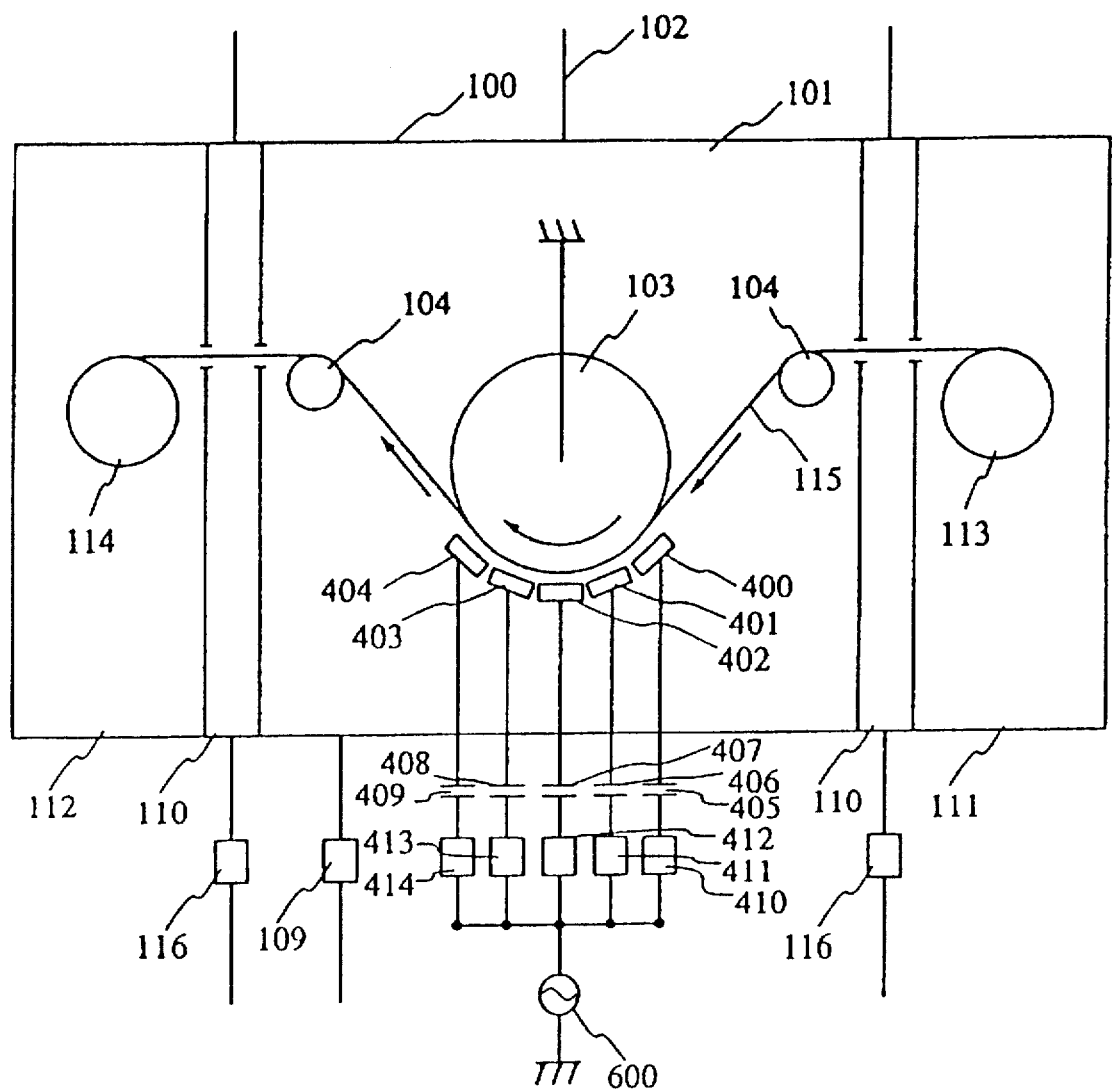
FIG. 7 is a schematic view showing another embodiment of the plasma processing system of the present invention.

In this embodiment, high frequency power is applied to each of the counter electrodes 400 to 404 from a common power source 600 through different matching boxes 410 to 414 and different blocking capacitors 405 to 409 as shown in FIG. 7.

If the blocking capacitors 405 to 409 are of the same type and the matching boxes 410 to 414 are set to the same matching condition, the power to be applied to each of the electrodes 400 to 404 is substantially equal between the electrodes 400 to 404. However, if the different matching conditions are used for the respective matching boxes, the power to be applied to the counter electrodes is varied in accordance with the matching condition.

For example, in the case where the matching condition of the matching box 414 is set to such a state that there is no reflection wave (i.e., a state where an impedance matching is perfectly performed), and the matching conditions of the matching boxes 413 to 410 are set to be gradually more deviated from the perfect impedance matching state in this order, the effective value of the high frequency power to be supplied to each counter electrode is gradually more reduced in the order from the electrode 404 to the electrode 400. That is, high frequency powers having different magnitudes can be applied to the counter electrodes using the common power source.

Accordingly, the same effect as shown in FIG. 4 can be obtained using the construction of this embodiment.

(Embodiment 8)

In this embodiment, each of the plural counter electrodes 105 of the embodiment 1 (see FIG. 2) is designed to have a different area therebetween. In the case where a common power source 108 is provided for the plural counter electrodes as shown in FIG. 2, the counter electrodes are supplied with the same power. A parameter which is associated with the intensity of discharge is a power density (a value obtained by dividing power supplied to an electrode by the area of the electrode), and thus the intensity of discharge to be applied to each counter electrode is varied by changing the area of each counter electrode in the case of FIG. 2.

Accordingly, in the case where the five electrodes 105 are gradually decreased in area from the upstream side to the downstream side of the feeding direction of the tape-shaped or film-shaped substrate 115, the power density for the discharging can be gradually (stepwise) increased at five levels in the feeding direction of the substrate 115.

With this arrangement, when a carbon film is formed on a substrate while feeding the substrate in its feeding direction, the carbon film whose hardness gradually increases from the substrate side to the surface of the film can be obtained. In other words, the carbon film becomes softer and has more excellent adhesiveness to the substrate at a portion nearer to the substrate side, and at the same time it becomes harder and has higher abrasion resistance at a portion nearer to the surface of the film.

According to one aspect of the present invention, plural counter electrodes are provided for only a single one electrode to realize stable and high-density discharging. Furthermore, the one electrode is designed to be cylindrical and each of the counter electrodes is designed to have a prescribed curvature, so that the interval between the one electrode and each counter electrode can be kept to be substantially fixed at any position, and the stable discharging can be induced.

Furthermore, according to another aspect of the present invention, plural counter electrodes are provided for only a single one electrode in one direction, and a different high-frequency power is applied to each of the counter electrodes. Therefore, when the film formation is conducted on a tape-shaped or film-shaped substrate while feeding the substrate in an arrangement direction of the electrodes, a film whose film quality (hardness or the like) varies in the thickness direction can be continuously formed on the substrate.

According to another aspect of the present invention, plural counter electrodes are provided for only a single one electrode in one direction, and the interval between the feeding counter and the counter electrodes is varied in accordance with each counter electrode. Therefore, when the film formation is conducted on a tape-shaped or film-shaped substrate while feeding the substrate in an arrangement direction of the electrodes, a film whose film quality (hardness or the like) varies in the thickness direction can be continuously formed on the substrate.

According to the another aspect of the present invention, plural counter electrodes are provided for only a single one electrode in one direction, and the area of the counter electrodes is varied in accordance with each counter electrode. Therefore, when the film formation is conducted on a film-shaped or ribbon-shaped substrate while feeding the substrate in the arrangement direction of the counter electrodes, a film whose film quality (hardness or the like) varies in the thickness direction can be continuously formed on the substrate.

Although the present invention has been described in conjunction with the preferred embodiments of the invention, various modifications may be made by those ordinary skilled in the art without departing the scope of the appended claims. For example, the plasma processing of the present invention may be used for forming a semiconductor film on a flexible substrate or an etching process. This can be performed by changing the gases to be introduced into the chamber.

What is claimed is:

1. A method of forming a protective carbon coating on a substrate having a magnetic layer thereon in a plasma processing apparatus having a first electrode and a plurality of second electrodes which are disposed adjacent to said first electrode, said method comprising the step of:

supplying a reactive gas into the space between a first electrode and a plurality of second electrodes;

applying a voltage between said first electrode and said plurality of second electrodes to convert said reactive gas into plasma;

feeding said substrate between said first electrode and said plurality of second electrodes; and forming a protective carbon coating on said substrate, said carbon film having a hardness which is smaller at portion close to said substrate and larger at a portion close to an outer surface thereof.

2. The method of claim 1 wherein said reactive gas includes ethylene mixed with hydrogen.

3. The method of claim 1 wherein a gap between said first electrode and said plurality of second electrodes is not larger than 10 mm.

4. A method of forming a protective film comprising the steps of:

preparing an electrode and a plurality of counter electrodes adjacent to said electrode in a reaction chamber;

moving a substrate having a magnetic layer thereon between an electrode and a plurality of counter electrodes wherein said plurality of counter electrodes are arranged in a direction in which said substrate moves;

introducing a carbon containing gas into said reaction chamber;

applying a high frequency voltage independently to said plurality of counter electrodes to convert said carbon containing gas into a plasma;

depositing a carbon film by using said plasma on said substrate with said substrate being proceeded, wherein said high frequency voltage is increased in said direction along which said substrate moves.

5. The method of claim 4 wherein said substrate comprises a resin film on which said magnetic layer is provided.

6. The method of claim 5 wherein said resin film comprises a polyimide.

7. A method of forming a protective film comprising the steps of:

preparing an electrode and a plurality of counter electrodes adjacent to said electrode in a reaction chamber;

moving a substrate having a magnetic layer thereon between an electrode and a plurality of counter electrodes wherein said plurality of counter electrodes are arranged in a direction in which said substrate moves;

introducing a carbon containing gas into said reaction chamber;

applying a high frequency voltage to said plurality of counter electrodes to convert said carbon containing gas into a plasma;

depositing a carbon film by using said plasma on said substrate with said substrate being proceeded, wherein a gap between said electrode and said plurality of counter electrodes is decreased in said direction along which said substrate moves.

8. The method of claim 7 wherein said substrate comprises a resin film on which said magnetic layer is provided.

9. The method of claim 7 wherein said resin film comprises a polyimide.

10. The method of forming a protective film comprising the steps of:

preparing an electrode and a plurality of counter electrodes adjacent to said electrode in a reaction chamber;

moving a substrate having a magnetic layer thereon between said electrode and said plurality of counter electrodes wherein said plurality of counter electrodes are arranged in a direction in which said substrate moves;

introducing a carbon containing gas into said reaction chamber;

applying a high frequency voltage to said plurality of counter electrodes from a common power source to convert said containing gas into a plasma;

depositing a carbon film by using said plasma on said substrate with said substrate being proceeded, wherein a matching condition for each of said plurality of counter electrodes is controlled so that an intensity of said plasma increases in said direction along which said substrate moves.

11. The method of claim 10 wherein said substrate comprises a resin film on which said magnetic layer is provided.

12. The method of claim 10 wherein said resin film comprises a polyimide.

13. A method of forming a protective film comprising the steps of:

preparing an electrode and a plurality of counter electrodes adjacent to said electrode in a reaction chamber;

moving a substrate having a magnetic layer thereon between said electrode and said plurality of counter electrodes wherein said plurality of counter electrodes are arranged in a direction in which said substrate moves;

introducing a carbon containing gas into said reaction chamber;

applying a high frequency voltage from a common power source to said plurality of counter electrodes to convert said carbon containing gas into a plasma;

depositing a carbon film by using said plasma on said substrate with said substrate being proceeded, wherein an area of said plurality of counter electrodes is decreased in said direction along which said substrate moves.

14. The method of claim 13 wherein said substrate comprises a resin film on which said magnetic layer is provided.

15. The method of claim 13 wherein said resin film comprises a polyimide.

16. The method of claim 4, 7, 10 or 13 wherein said carbon containing gas includes ethylene mixed with hydrogen gas.

17. The method of claim 4, 10, or 13 wherein a gap between said electrode and said plurality of counter electrodes is not larger than 10 mm.

* * * * *